United States Patent
Koide et al.

(10) Patent No.: US 7,915,541 B2
(45) Date of Patent: Mar. 29, 2011

(54) MULTILAYER INTERCONNECTION SUBSTRATE AND MANUFACTURING METHOD THEREFOR

(75) Inventors: Masateru Koide, Kawasaki (JP); Tomoyuki Abe, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 260 days.

(21) Appl. No.: 12/099,450

(22) Filed: Apr. 8, 2008

(65) Prior Publication Data
US 2008/0192453 A1    Aug. 14, 2008

Related U.S. Application Data

(63) Continuation of application No. PCT/JP2005/018684, filed on Oct. 11, 2005.

(51) Int. Cl.
*H05K 1/11* (2006.01)
*H01R 12/04* (2006.01)

(52) U.S. Cl. .................. 174/262; 174/255

(58) Field of Classification Search .......... 174/262, 174/255
See application file for complete search history.

(56) References Cited

U.S. PATENT DOCUMENTS

| | | | |
|---|---|---|---|
| 5,396,034 A * | 3/1995 | Fujita et al. | 174/261 |
| 5,488,542 A * | 1/1996 | Ito | 361/793 |
| 5,768,108 A | 6/1998 | Miura et al. | |

FOREIGN PATENT DOCUMENTS

| | | |
|---|---|---|
| JP | 55-11883 A | 1/1980 |
| JP | 05-082929 A | 4/1993 |
| JP | 9-148743 A | 6/1997 |
| JP | 10-93240 A | 4/1998 |
| JP | 11-274347 A | 10/1999 |
| JP | 2000-216544 A | 8/2000 |
| JP | 2002-271038 A | 9/2002 |

OTHER PUBLICATIONS

International Search Report of PCT/JP2005/018684; date of mailing Dec. 20, 2005.
Japanese Office Action dated Jan. 4, 2011, issued in corresponding Japanese Patent Application No. 2007-539783. (w/partial English translation).

* cited by examiner

*Primary Examiner* — Ishwarbhai B Patel
(74) *Attorney, Agent, or Firm* — Westerman, Hattori, Daniels & Adrian, LLP

(57) ABSTRACT

According to an aspect of an embodiment, a multilayer interconnection substrate includes a resin substrate layer including a first insulating layer made of a resin, and a first interconnection layer made of a conductive material, a ceramic substrate layer including a second insulating layer made of a ceramic, and a second interconnection layer made of a conductive material, a mechanically bonding layer mechanically bonding the resin substrate layer and the ceramic substrate layer which are laminated, and an electrically bonding member penetrating the mechanically bonding layer and electrically bonding the resin substrate layer and the ceramic substrate layer.

7 Claims, 6 Drawing Sheets

MULTILAYER INTERCONNECTION SUBSTRATE AND MANUFACTURING METHOD THEREFOR

CROSS-REFERENCE TO RELATED APPLICATION

This application is a U.S. continuation application filed under 35 USC 111(a) claiming benefit under 35 USC 120 and 365(c) of PCT application JP2005/018684, filed Oct. 11, 2005. The foregoing application is hereby incorporated herein by reference.

BACKGROUND

1. Field

The present art relates to a multilayer interconnection substrate and a manufacturing method therefor, and in particular, to a multilayer interconnection substrate including different types of substrate layers, and a manufacturing method therefor.

2. Description of the Related Art

Conventionally, multilayer interconnection substrates having a plurality of interconnection layers are used commonly as interconnection substrates for increasing a density. Further, as multilayer interconnection substrates, ceramic multilayer interconnection substrates using a ceramic as an insulating material on which an interconnection layer is formed, and resin multilayer interconnection substrates using a resin as an insulating material, are used commonly.

The ceramic multilayer interconnection substrates are advantageous since the number of laminated layers can be increased and they have a low thermal expansion coefficient. However, they are not suitable for minute interconnection. Therefore, when interconnection is to have an increased density, it is necessary to increase the number of laminated layers, and thus, a product cost increases accordingly.

On the other hand, the resin multilayer interconnection substrates are not expensive, minute interconnection is allowed, and also, it is possible to increase the number of layers. However, a thermal expansion coefficient is high, and thereby, mounting reliability for when electronic devices such as semiconductor devices are mounted is low.

Therefore, as being discussed in Japanese Laid-Open Patent Application 55-11883, a multilayer interconnection substrate in which ceramic are placed on both sides of a resin multilayer interconnection substrate is proposed.

However, in the multilayer interconnection substrate discussed in Japanese Laid-Open Patent Application 55-11883, the ceramic does not have interconnection, and is used merely as a reinforcement material. Therefore, interconnection is provided entirely in the resin multilayer interconnection substrate, and thus, freedom in interconnection design is low.

Further, the ceramic functioning as the reinforcement martial is provided only on both sides, i.e., obverse and reverse sides of the resin multilayer interconnection substrate. Therefore, a stress caused by thermal expansion of the resin multilayer interconnection substrate cannot be sufficiently eased only by the ceramic provided only on both sides, i.e., obverse and reverse sides of the resin multilayer interconnection substrate. Therefore, it is not possible to sufficiently increase mounting reliability even when the ceramic is thus used.

SUMMARY

According to an aspect of an embodiment, a multilayer interconnection substrate comprises a resin substrate layer comprising a first insulating layer made of a resin, and a first interconnection layer made of a conductive material, a ceramic substrate layer comprising a second insulating layer made of a ceramic, and a second interconnection layer made of a conductive material, a mechanically bonding layer mechanically bonding the resin substrate layer and the ceramic substrate layer which are laminated, and an electrically bonding member penetrating the mechanically bonding layer and electrically bonding the resin substrate layer and the ceramic substrate layer.

Figure 1:
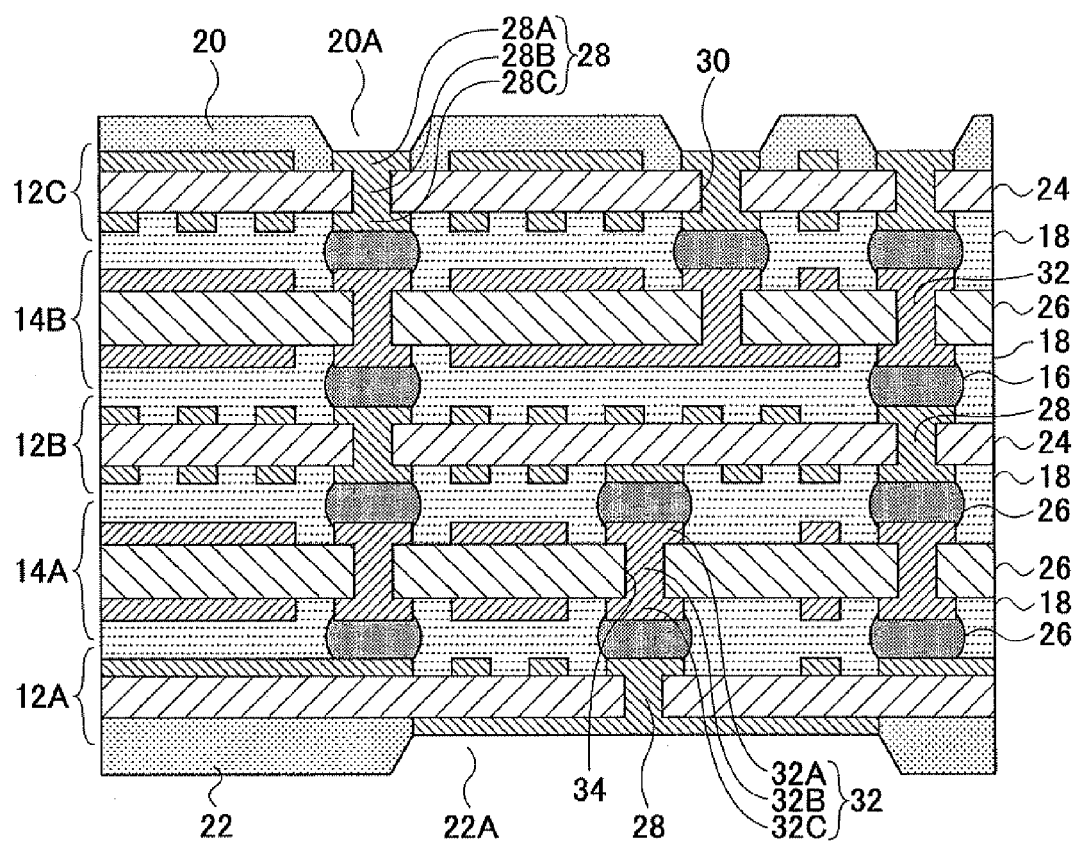
FIG. 1 shows a sectional view of a multilayer interconnection substrate in a first embodiment of the present art.

DESCRIPTION OF THE REFERENCE NUMERALS 10A and 10B 10C: multilayer interconnection substrate;
12A through 12C: resin substrate layer;
14A, 14B: ceramic substrate layer;
16: solder bump;
18: adhesive layer;
24: resin layer;
26: ceramic layer;
28, 32, 42A, 42B: interconnection layer;
28A, 32A: upper interconnection layer;
28B, 32B: via part;
28C, 32C: lower interconnection layer;
30, 34: via hole;
36: metal substrate layer;
38; conductive metal plate; and
40; insulating film

DETAILED DESCRIPTION OF THE PREFERRED EMBODIMENTS

Next, a best mode for embodying the present art will be described with reference to figures.

FIG. 1 shows a multilayer interconnection substrate 10A in a first embodiment of the present art. As shown in FIG. 1, the multilayer interconnection substrate 10A has such a configuration that, from a bottom layer, a resin substrate layer 12A, a ceramic substrate layer 14A, a resin substrate layer 12B, a ceramic substrate layer 14B and a resin substrate layer 12C, are laminated in the stated order as shown.

Further, the respective substrate layers 12A, 14A, 12B, 14B and 12C are bonded mutually by means of adhesive layers 18 (acting as mechanical bonding layers). Further, electrical connection among the respective substrates 12A, 14A, 12B, 14B and 12C is provided by means of solder bumps 16 (acting as electrically bonding members) in the present embodiment.

Further, at a highest part of the multilayer interconnection substrate 10A, a solder resist 20 is provided. At a lowest part, a solder resist 22 is provided. At predetermined positions of the solder resists 20, 22, opening parts 20A, 22A are formed, whereby interconnection layers 28 formed on the resin substrates layers 12A, 12C are exposed to the outside.

Next, specific configurations of the resin substrate layers 12A through 12C and the ceramic substrate layers 14A, 14B will be described.

First, with the use of FIGS. 2A through 2C, the resin substrate layers 12A through 12C will be described. It is noted that the resin substrate layers 12A through 12C are identical except that patterns of the interconnection layers 28 are different in shape. Therefore, they will be described together.

The resin substrate layers 12A through 12C are configured by resin layers 24 (acting as first insulating layers) and the interconnection layers 28 (acting as first interconnection layers).

For the resin layers 24, for example, a resin which is an epoxy resin having a thermosetting property, and is generally used as an insulating material for a build-up process may be used. The resin for a build-up process (hereinafter, referred to as a build-up resin) has a shape of a film ordinarily, and micro-fabrication thereof is allowed. Further, at positions of the resin layers 24 at which via parts 28B described below are formed, via holes 30 are formed. The via holes 30 can be formed by means of, for example, laser machining or such.

The interconnection layers 28 are formed of copper (Cu) having high electrical conductivity. The interconnection layers 28 include upper interconnection layers 28A formed to have patterns on top surfaces of the resin layers 24, lower interconnection layers 28C formed to have patterns on bottom surfaces of the resin layers 24, and via parts 28B connecting the upper interconnection layers 28A and the lower interconnection layers 28C, respectively. The upper interconnection layers 28A, the via parts 28B and the lower interconnection layers 28C are formed integrally, respectively. Further, the via parts 28B are formed inside of the via holes 30 formed in the resin layers 24, respectively.

As mentioned above, the interconnection layers 28 are formed of cupper having high electrical conductivity. Therefore, the interconnection layers 28 have high electrical characteristics and high-frequency characteristics. Further, micro-fabrication is allowed in the build-up resin, which the resin layers 24 are formed of. Therefore, the via holes 30 are formed in the resin layers 24 at high density and with high precision. Further, the respective interconnection layers 28A, 28C can be formed with high precision as a result of a build-up process being used. Therefore, the interconnection layers 28 are formed on the resin layers 24 with high precision accordingly.

Figure 3A:
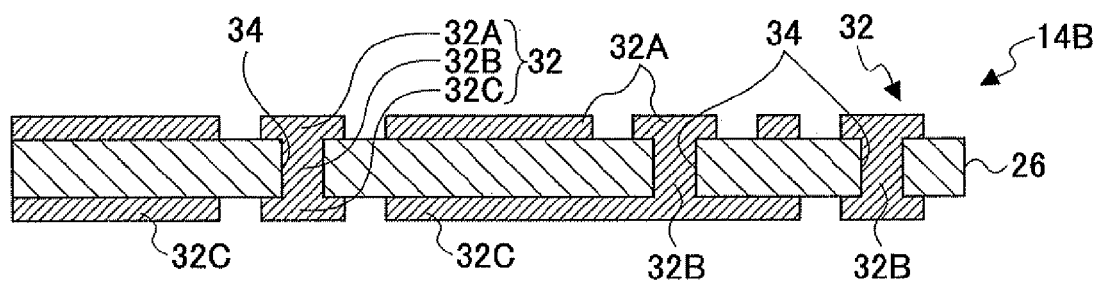
FIG. 3A shows a sectional view of a ceramic substrate layer (highest layer) included in the multilayer interconnection substrate in the first embodiment of the present art.
Figure 3B:
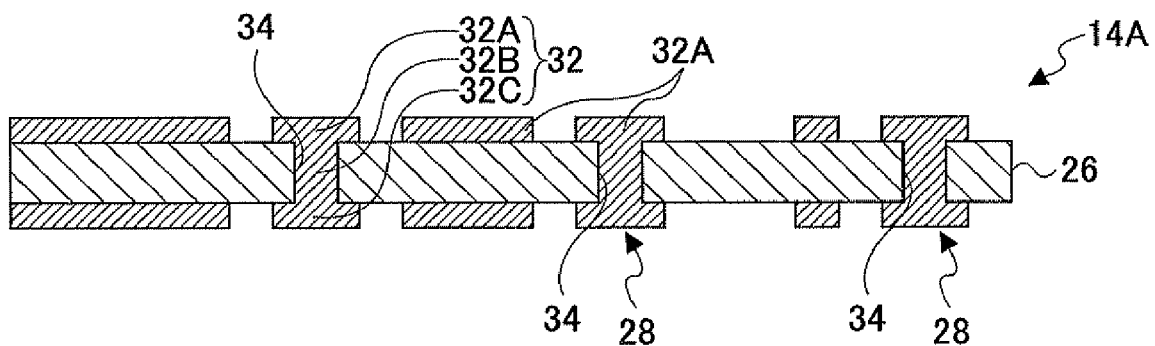
FIG. 3B shows a sectional view of a ceramic substrate layer (lowest layer) included in the multilayer interconnection substrate in the first embodiment of the present art.

Next, with reference to FIGS. 3A and 3B, the ceramic substrate layers 14A, 14B will be described. It is noted that the ceramic substrate layers 14A, 14B are identical except that patterns of interconnection layers 32 are different in shape. Therefore, they will be described together.

The ceramic substrate layers 14A, 14B are configured by ceramic layers 26 (acting as second insulating layers) and the interconnection layers 32 (acting as second interconnection layers).

The ceramic layers 26 are formed as a result of, for example, inorganic substance such as alumina, aluminum nitride or zirconia being baked and being shaped like plates. The inorganic substance such as alumina has a lower thermal expansion coefficient than that of the resin layers 24. Thereby, the ceramic layers 14A, 14B have a lower thermal expansion coefficient than that of the resin substrate layers 12A, 12B and 12C. That is, even when heat is given to the ceramic substrate layers 14A, 14B, a deformation amount of the ceramic substrate layers 14A, 14B caused thereby is small.

Further, at positions of the ceramic layers 26 at which via parts 32B described below are formed, via holes 34 are formed. The via holes 34 can be formed by means of, different from the via holes 30 formed in the resin layers 24, drilling or such before the ceramic is baked.

The interconnection layers 32 are formed of copper (Cu) having high electrical conductivity, the same as the interconnection layers 28. The interconnection layers 32 include upper interconnection layers 32A formed to have patterns on top surfaces of the ceramic layers 26, lower interconnection layers 32C formed to have patterns on bottom surfaces of the ceramic layers 26, and via parts 32B connecting the upper interconnection layers 32A and the lower interconnection layers 32C, respectively. The upper interconnection layers 32A, the via parts 32B and the lower interconnection layers 32C are formed integrally, respectively. Further, the via parts 32B are formed inside of the via holes 34 formed in the ceramic layers 26, respectively.

The via holes 34 formed in the ceramic layers 26 are formed by means of drilling or such as mentioned above, and the respective interconnection layers 32A, 32C are formed by means of screen printing or such. Therefore, in comparison to the resin substrate layers 12A through 12C, forming the interconnection layers 32 to the ceramic substrate layers 14A, 14B with high precision is difficult.

The respective substrate layers 12A, 14A, 12B, 14B, 12C are bonded by the adhesive layers 18 made of the thermosetting resin as mentioned above, and are electrically connected by means of the solder bumps 16 penetrating through the adhesive layers 18, respectively.

The multilayer interconnection substrate 10A configured as mentioned above has the configuration in which the resin substrate layers 12A through 12C and the ceramic substrate layers 14A, 14B, having the mutually different characteristics, are laminated. Specifically, the resin substrate layers 12A through 12C having the interconnection layers 28 formed with high density (i.e., with high interconnection density) but having the large thermal expansion coefficient, and the ceramic substrate layers 14A, 14B for which a high density is not available in comparison to the resin substrate layers 12A through 12C but having the small thermal expansion coefficient (i.e., having satisfactory mechanical characteristics), are laminated. Therefore, in the multilayer interconnection substrate 10A in the present embodiment of the present art, the interconnection layers 28 can have a high density, and also, mounting reliability can be improved.

Further, in the present embodiment, the adhesive layers 18 made of the resin are used for bonding the respective substrate layers 12A through 12C and 14A, 14B. Therefore, even when unevenness occurs on the surfaces of the resin layers 24 and the ceramic layers 26 as result of the interconnection layers 28 being formed, the resin layers 24 can easily enter the unevenness so that voids are prevented from occurring. As a result, in subsequent heating processing or such, clacks are prevented from occurring in the multilayer interconnection substrate 10A, and thus, reliability can be improved.

It is noted that, in the present embodiment, the resin substrate layers 12A through 12C and the ceramic substrate layers 14A, 14B are laminated alternately. However, a laminating structure should not necessarily be of such an alternate structure. It is preferable to have a laminating structure such that thermal expansion can be effectively reduced, by means of considering thermal expansion coefficients, arranging positions of the respective interconnection layers 28A, 28C, 32A, 32C, or such.

Next, a manufacturing method for a multilayer interconnection substrate in one embodiment of the present art will be described. It is noted that, in a description below, a manufacturing method for the above-mentioned multilayer interconnection substrate 10A will be described as an example.

Figure 2A:
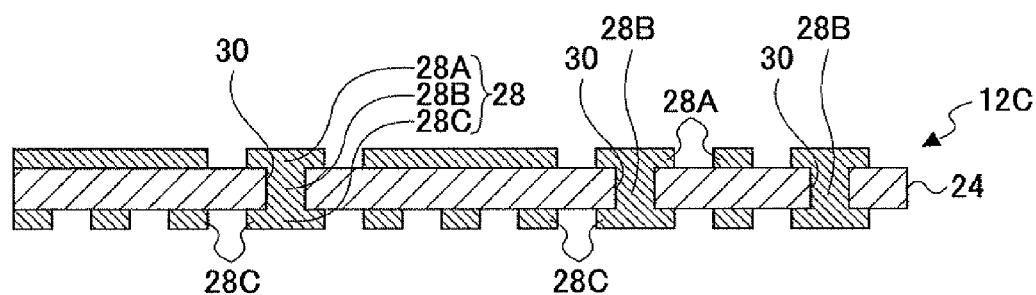
FIG. 2A shows a sectional view of a resin substrate layer (highest layer) included in the multilayer interconnection substrate in the first embodiment of the present art.
Figure 2B:
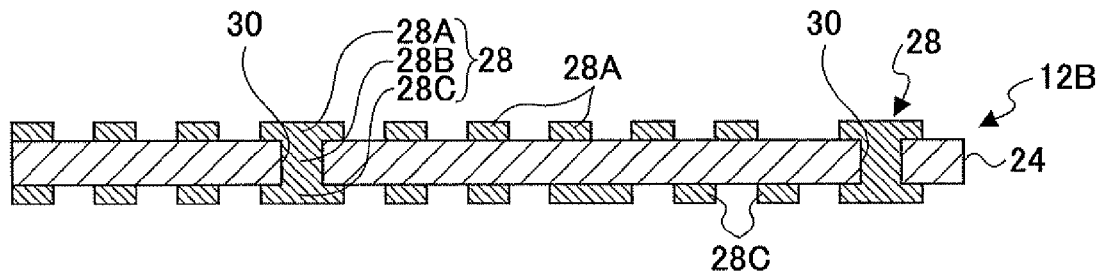
FIG. 2B shows a sectional view of a resin substrate layer (middle layer) included in the multilayer interconnection substrate in the first embodiment of the present art.
Figure 2C:
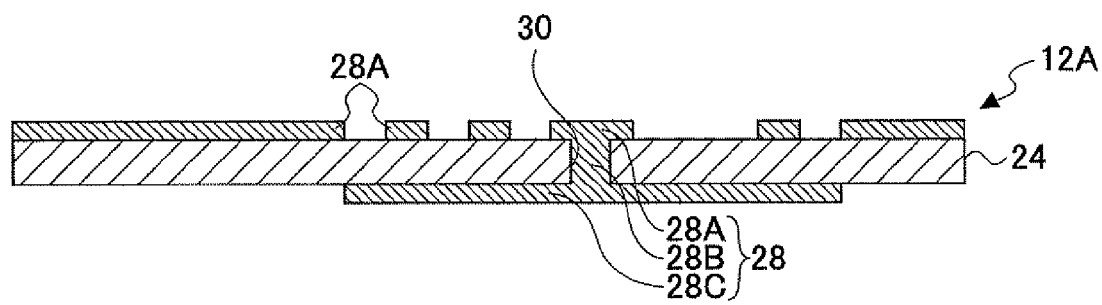
FIG. 2C shows a sectional view of a resin substrate layer (lowest layer) included in the multilayer interconnection substrate in the first embodiment of the present art.

In order to manufacture the multilayer interconnection substrate 10A, the resin substrate layers 12A through 12C, in which the interconnection layers 28 are formed on the resin layers 24, respectively, shown in FIGS. 2A through 2C, are manufactured. Also, the ceramic substrate layers 14A, 14B, in which the interconnection layers 32 are formed on the ceramic layers 26, respectively, shown in FIGS. 3A, 3B, are manufactured. The resin substrate layers 12A through 12C can be manufactured in a semi-active process which is a build-up process, a laser machining process and so forth. The ceramic substrate layers 14A, 14B can be manufactured in a screen printing process, a drilling process and so forth.

After the respective substrate layers 12A through 12C, 14A, 14B are thus manufactured, the solder bumps 16 are provided to the interconnection layers 28 formed on the resin substrates 12A through 12C, respectively, or the interconnection layers 32 formed on the ceramic substrate layers 14A, 14B, respectively, or, the solder bumps 16 are provided to the interconnection layers 28 formed on the resin substrates 12A through 12C, respectively, and also, to the interconnection layers 32 formed on the ceramic substrate layers 14A, 14B, respectively.

In the present embodiment, as one example, the solder bumps 16 are provided to the interconnection layers 28 formed on the resin substrate layers 12A through 12C, respectively.

In the present embodiment, the bumps 16 which are commonly used in semiconductor devices or such are used for electrical connection among the respective substrate layers 12A through 12C, 14A, 14B. Therefore, the manufacturing method for the multilayer interconnection substrate 10A can be simplified, and the costs therefor can be reduced. It is noted that, instead of solder bumps, other electrodes such as stud bumps or such may be used.

Figure 4:
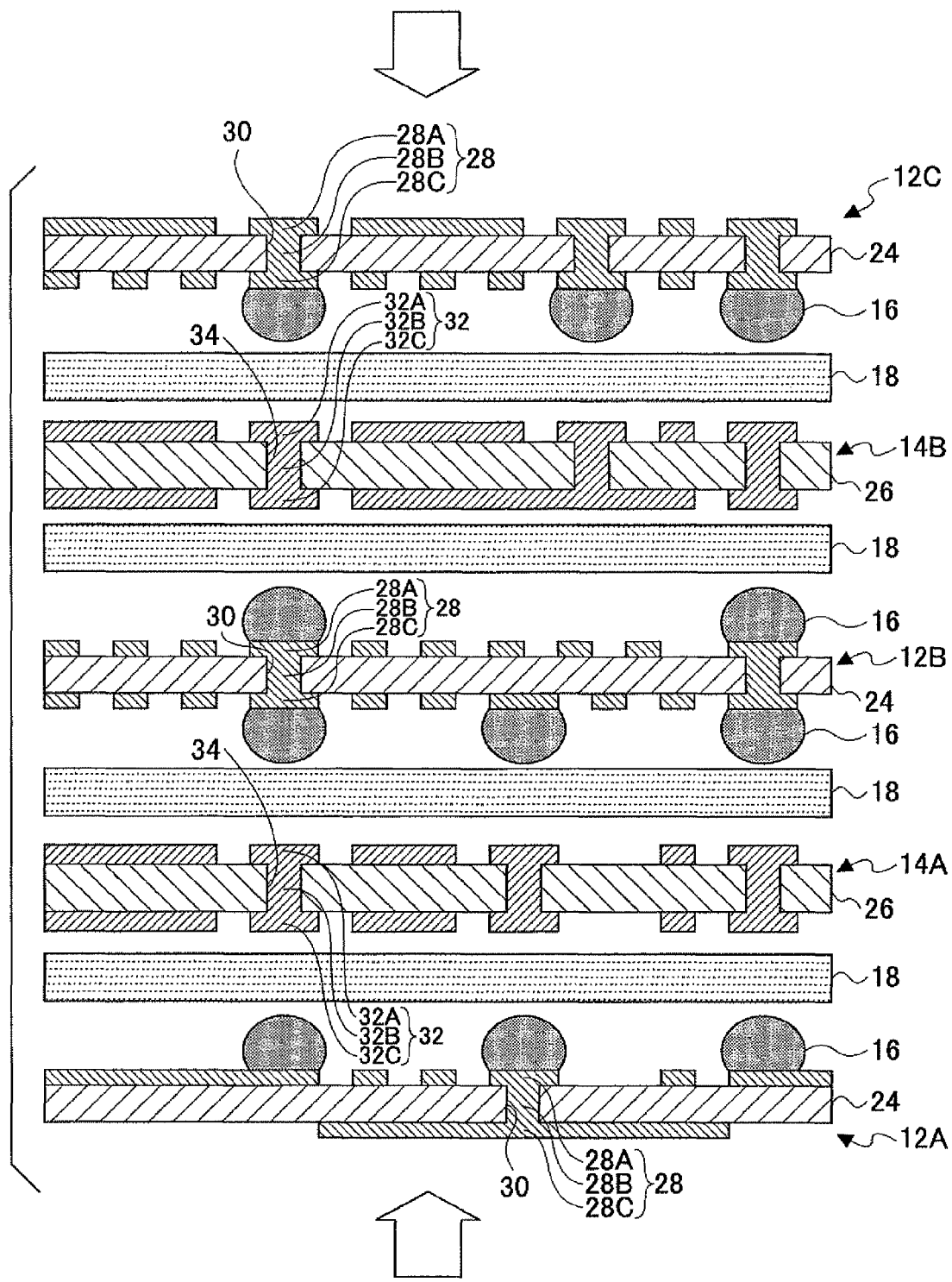
FIG. 4 illustrates a manufacturing method for the multilayer interconnection substrate in the first embodiment of the present art and shows a state before lamination.

After the solder bumps 16 are provided as mentioned above, the resin substrate layers 12A through 12C and the ceramic substrate layers 14A, 14B are laminated alternately with the adhesive layers 18 being inserted thereamong, as shown in FIG. 4. At this time, it is necessary to positively carry out positioning between the solder bumps 16 and the interconnection layers 28 to which the solder bumps 16 are connected. For this purpose, alignment marks or such may be provided on the respective substrate layers 12A through 12C, 14A, 14B. Further, in the present embodiment, the adhesive layers 18 have a film shape. As a result, the laminating process can be easily carried out.

Figure 5:
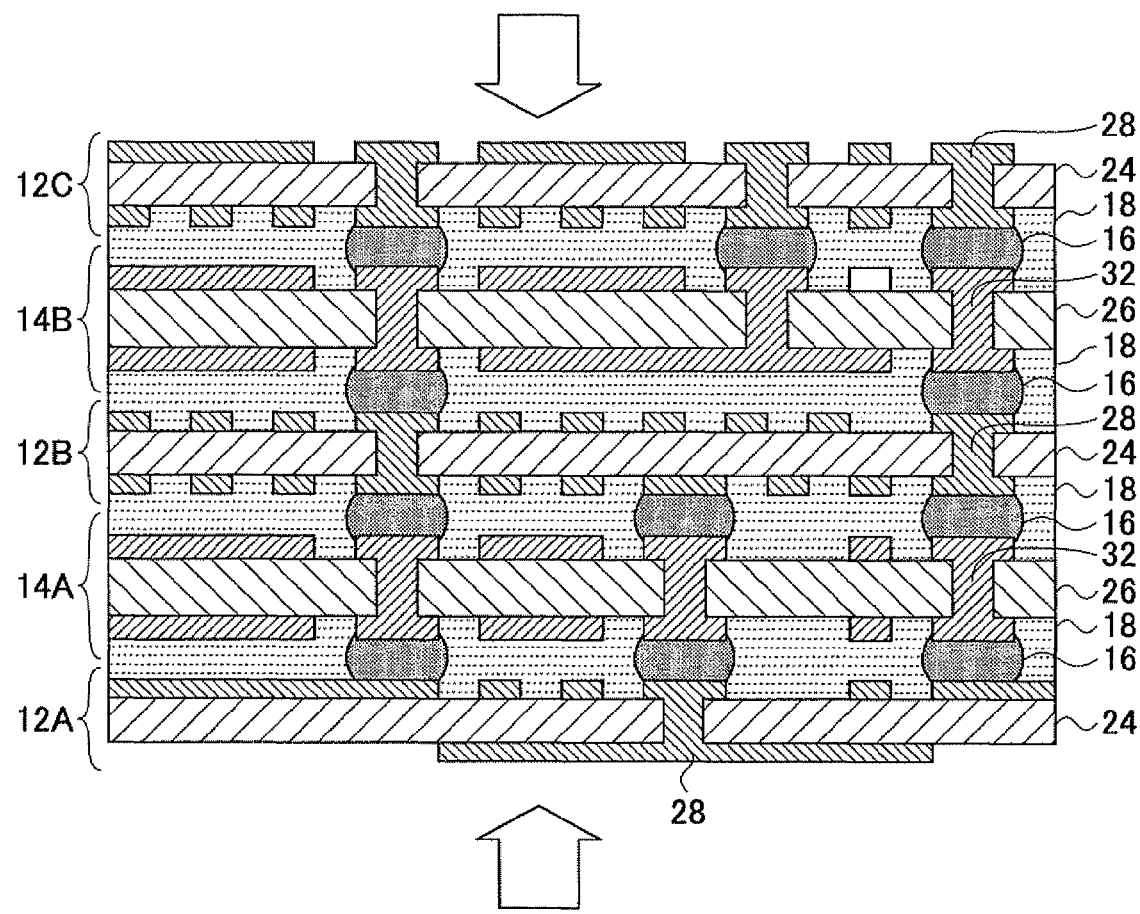
FIG. 5 illustrates the manufacturing method for the multilayer interconnection substrate in the first embodiment of the present art and shows a state after the lamination.

Next, the resin substrate lawyers 12A through 12C and the ceramic substrate layers 14A, 14B, which are thus laminated with the adhesive layers 18 being inserted therebetween, are pressed and heated. Thereby, the adhesive layers 18 are hardened thermally, and as a result, the respective substrate layers 12A through 12C, 14A, 14B are bonded mutually as shown in FIG. 5. At this time, the solder bumps 16 penetrate through the adhesive layers 18 by means of the pressing force to bond to the interconnection layers 32. At this time, by setting a temperature of the heating to be higher than a melting temperature of the solder, it is possible to more positively connect the solder bumps 16 with the interconnection layers 32 electrically.

As mentioned above, the respective substrate layers 12A through 12C, 14A, 14B are mechanically bonded by means of the adhesive layers 18. Also, by means of the solder bumps 16, the respective substrate layers 12A through 12C, 14A, 14B are electrically bonded. Then, solder resists 20, 22 are formed. Thus, the multilayer interconnection substrate 10A shown in FIG. 1 is manufactured.

In the above-mentioned manufacturing method for the multilayer interconnection substrate 10A, the resin substrate layers 12A through 12C in which the interconnection layers 28 are previously formed on the resin layers 24, respectively, and the ceramic substrate layers 14A, 14B in which the interconnection layers 32 are previously formed on the ceramic layers 26, respectively, are laminated, and bonded by means of the adhesive layers 18. As a result, even the different types of the substrate layers 12A through 12C, 14A, 14B can be easily laminated. Further, the solder bumps 18 penetrate through the adhesive layers 18 when the respective substrate layers 12A through 12C, 14A, 14B are laminated. Thereby, the solder bumps 16 electrically connect the respective substrate layers 12A though 12C, 14A, 14B. Thus, electrical connection among the respective substrate layers 12A through 12C, 14A, 14B can be easily achieved.

Figure 6:
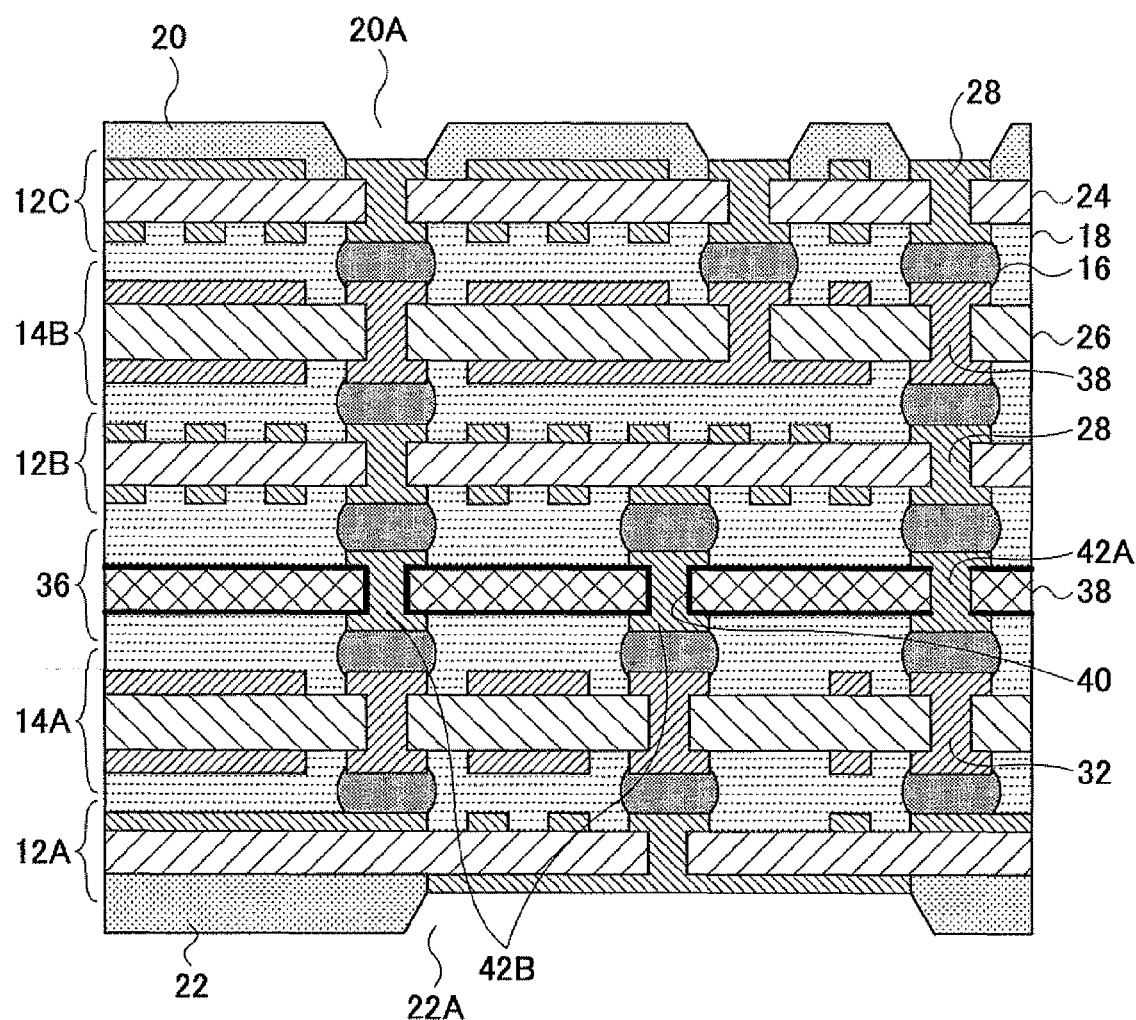
FIG. 6 shows a multilayer interconnection substrate in a second embodiment of the present art.

FIG. 6 shows a multilayer interconnection substrate 10B in a second embodiment of the present art.

In the multilayer interconnection substrate 10A in the first embodiment shown in FIG. 1, the resin substrate lawyers 12A through 12C and the ceramic substrate layers 14A, 14B are laminated. In the multilayer interconnection substrate 10B in the present embodiment, a metal substrate layer 36 is further laminated. It is noted that, in FIG. 6, the same reference numerals are given to the same configurations as those shown in FIG. 1, and duplicate description will be omitted.

The metal substrate layer 36 is configured by a conductive metal plate 38 and an insulating layer 40. The conductive metal plate 38 is formed of, for example, a copper metal having superior electrical conductivity. Further, in comparison to the above-mentioned respective interconnection layers 28A, 28C, 32A, 32C, a thickness of the conductive metal plate 38 is larger, also the conductive metal plate 38 is formed to have a wide area, and thus, the conductive metal plate 38 has low impedance.

Further, the metal substrate layer 36 has openings at positions at which interconnection layers 42A, 42B are formed. The insulating layer 40 is, for example, of a resin film having insulating property, and is formed to cover approximately the entire surface of the conductive metal plate 38.

However, in the present embodiment, in the openings at which the interconnection layers 42A are formed, the insulating layers 40 are not formed. Accordingly, the conductive metal plate 38 is electrically connected only to the interconnection layers 42A. In the present embodiment, the interconnection layers 42A are used as power supply wiring. Thus, the metal substrate layer 36 functions as a power supply layer.

As mentioned above, the metal substrate layer 36 has low impedance. Accordingly, when the metal substrate layer 36 is used as the power supply layer, a power supply loss can be reduced, and also, power supply with a large current can be carried out therewith. Instead, the metal substrate layer 36 may be used as a ground layer. In this case, the metal substrate layer 36 can be used as a shielding layer. As a result, the multilayer interconnection substrate 10B having superior noise characteristics can be achieved.

While the art herein disclosed has been described by means of specific embodiments and applications thereof, numerous modifications and variations could be made thereto by those skilled in the art without departing from the scope of the art set forth in the claims.

What is claimed is:

1. A multilayer interconnection substrate, comprising:
   A plurality of resin substrate layers each consisting an insulating layer made of a resin, and first interconnection layers made of a conductive material on both sides of the insulating layer respectively;
   a ceramic substrate layer including a ceramic layer, and second interconnection layers made of a conductive material on both sides of the ceramic layer respectively, the ceramic substrate layer being laminated and sandwiched between the plurality of resin substrate layers;
   bonding layers mechanically bonding between the plurality of resin substrate layers and the ceramic substrate layer; and
   a bonding member penetrating the bonding layers and electrically connecting the first interconnection layers and the second interconnection layers.

2. The multilayer interconnection substrate as claimed in claim 1, wherein:
   the first insulating layer is made of a build-up resin.

3. The multilayer interconnection substrate as claimed in claim 1, wherein:
   the first and second interconnection layers are made of copper.

4. The multilayer interconnection substrate as claimed in claim 1, wherein:
   the bonding layers include a thermosetting adhesive.

5. The multilayer interconnection substrate as claimed in claim 1, wherein:
   the bonding member comprises solder.

6. The multilayer interconnection substrate as claimed in claim 1, wherein:
   further a plate-shaped metal substrate layer made of a metal is laminated.

7. The multilayer interconnection substrate as claimed in claim 1, wherein:
   at least a top layer of the multilayer interconnection substrate is one of the plurality of resin substrate layers.

* * * * *